(12) United States Patent
Lee

(10) Patent No.: US 7,964,425 B2
(45) Date of Patent: Jun. 21, 2011

(54) METHOD FOR MANUFACTURING P TYPE GALLIUM NITRIDE BASED DEVICE

(75) Inventor: Jong Hee Lee, Gyeonggi-do (KR)

(73) Assignee: Theleds Co., Ltd., Yongin-si, Gyeonggi-do (KR)

( * ) Notice: Subject to any disclaimer, the term of this patent is extended or adjusted under 35 U.S.C. 154(b) by 605 days.

(21) Appl. No.: 11/992,381

(22) PCT Filed: Nov. 24, 2006

(86) PCT No.: PCT/KR2006/004996
§ 371 (c)(1), (2), (4) Date: Mar. 21, 2008

(87) PCT Pub. No.: WO2007/061260
PCT Pub. Date: May 31, 2007

(65) Prior Publication Data
US 2010/0159625 A1   Jun. 24, 2010

(30) Foreign Application Priority Data

Nov. 25, 2005  (KR) .................... 10-2005-0113311

(51) Int. Cl.
*H01L 33/00* (2010.01)

(52) U.S. Cl. .............. 438/45; 438/46; 257/E33.025
(58) Field of Classification Search ............. 438/45, 438/46; 257/E33.025
See application file for complete search history.

(56) References Cited

U.S. PATENT DOCUMENTS

| | | | |
|---|---|---|---|
| 7,345,323 B2 * | 3/2008 | Goetz et al. | 257/101 |
| 7,439,609 B2 * | 10/2008 | Negley | 257/615 |
| 2005/0167693 A1 * | 8/2005 | Goetz et al. | 257/103 |
| 2005/0211999 A1 * | 9/2005 | Negley | 257/94 |
| 2005/0224781 A1 * | 10/2005 | Kneissl et al. | 257/14 |

* cited by examiner

*Primary Examiner* — Thao Le
(74) *Attorney, Agent, or Firm* — The Nath Law Group; Jerald L. Meyer; Sungyeop Chung

(57) ABSTRACT

A method for manufacturing a p-type gallium nitride-based (GaN) device is disclosed. In accordance with the method, an Mg in an $MgN_x$ layer disposed on p-type gallium nitride is diffused into the p-type gallium nitride by a heat treatment to dope the p-type gallium nitride with the Mg while activating the diffused Mg simultaneously, eliminating a need for an additional heat treatment for the activation and preventing a nitrogen in the p-type gallium nitride from being separated therefrom.

6 Claims, 4 Drawing Sheets

[Figure 1]
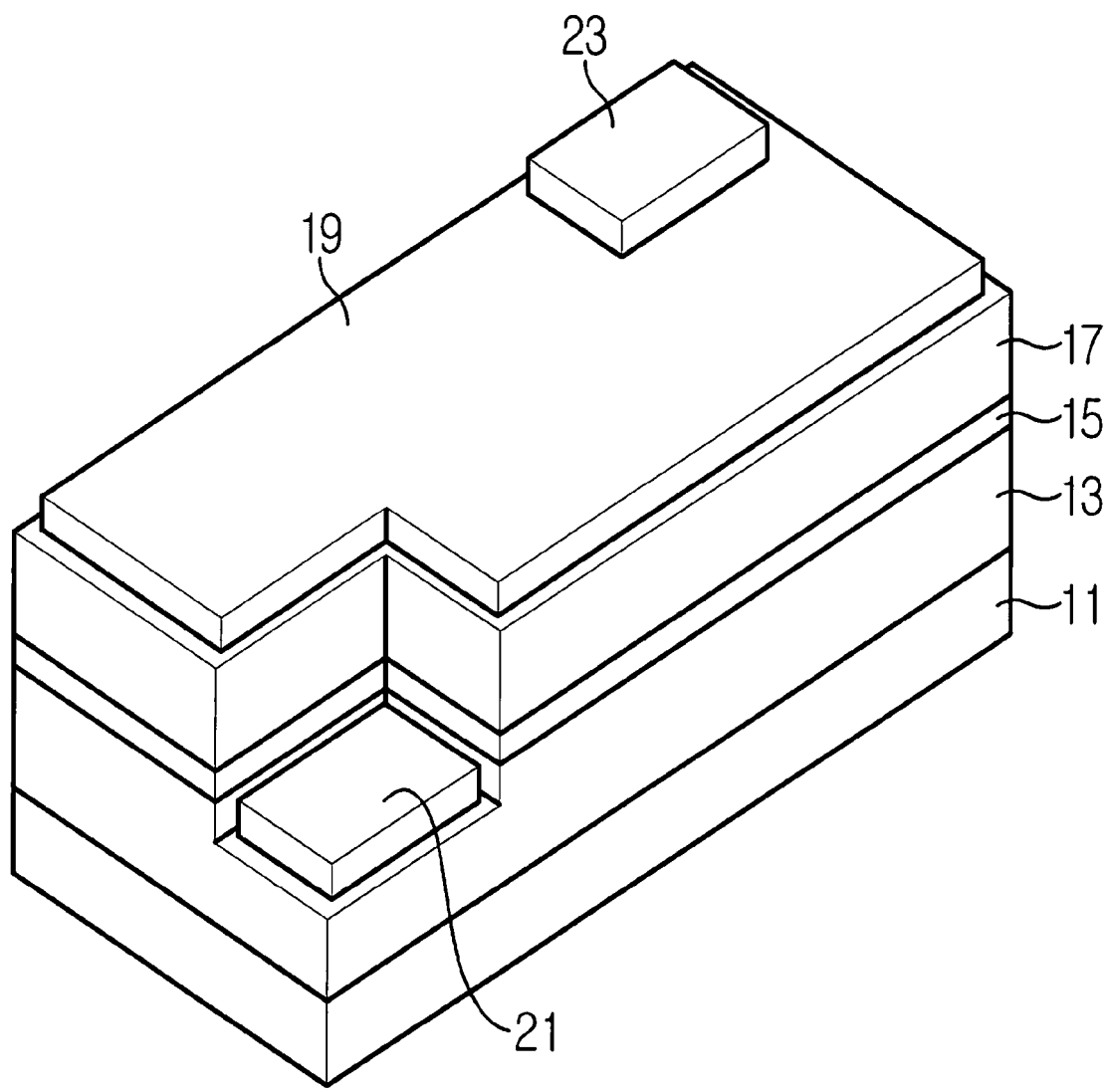
<Prior Art>

[Figure 2]
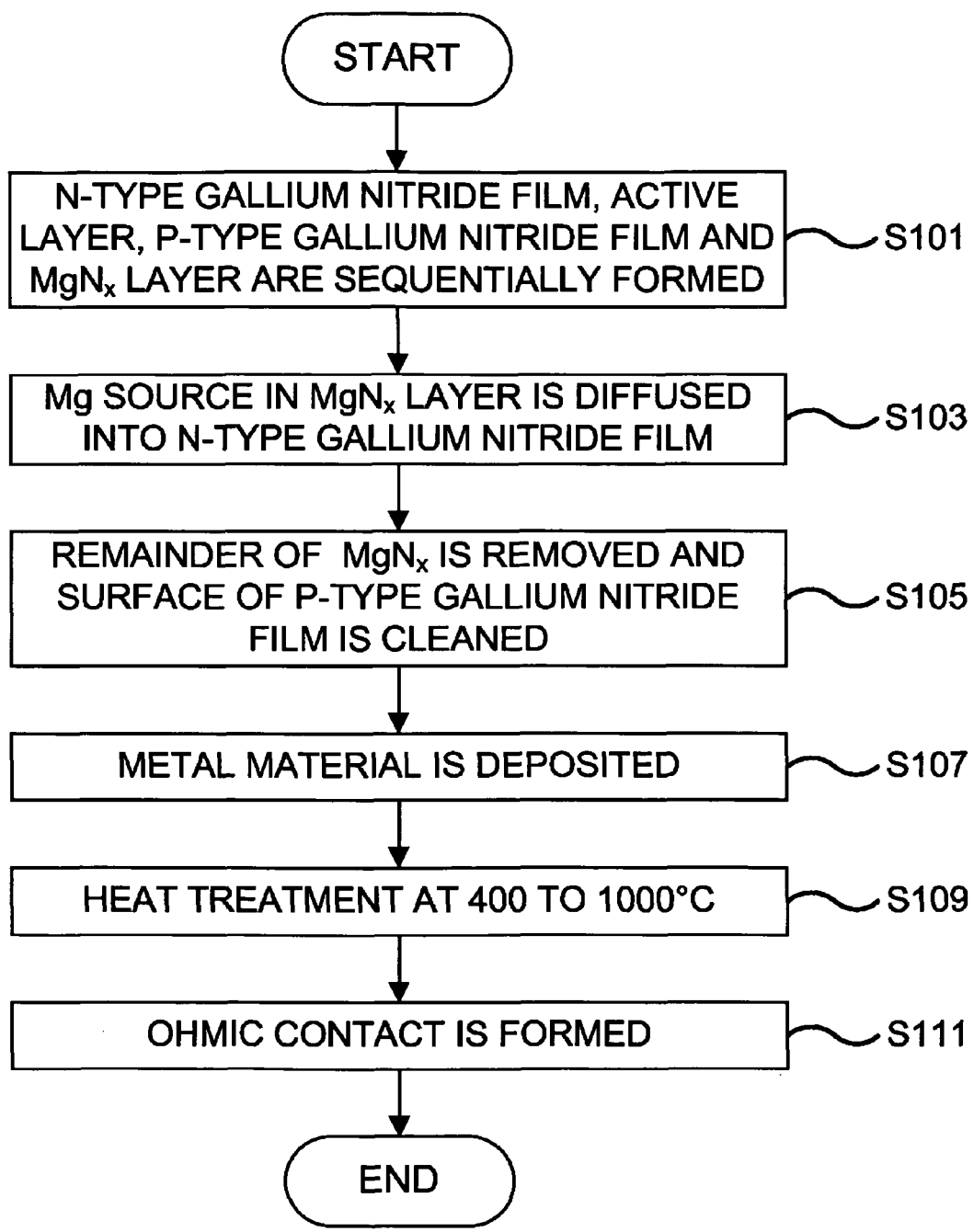

[Figure 3]
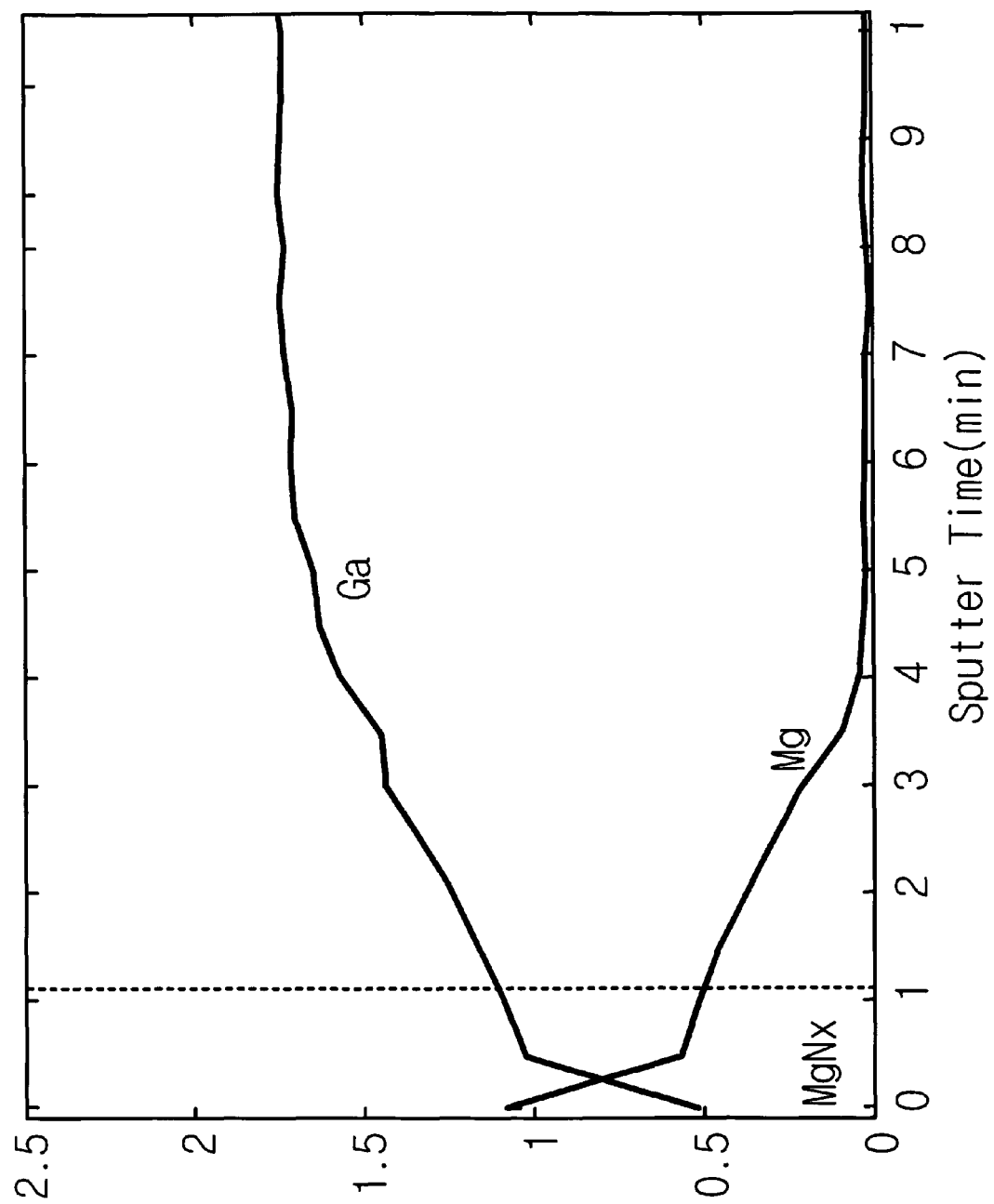

[Figure 4]
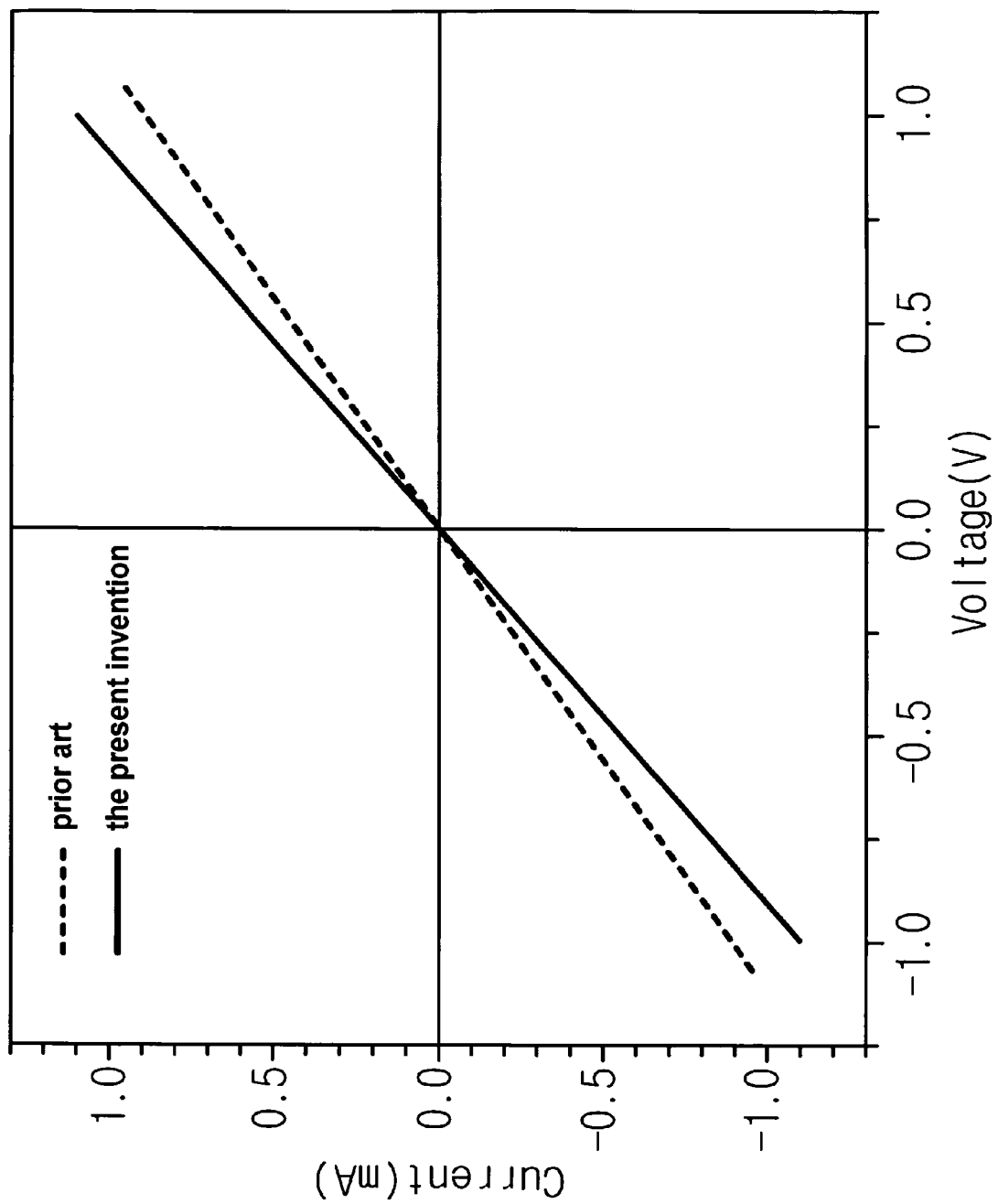

METHOD FOR MANUFACTURING P TYPE GALLIUM NITRIDE BASED DEVICE

TECHNICAL FIELD

The present invention relates to a method for manufacturing a p-type gallium nitride-based (GaN) device, in particular, to a method for manufacturing a p-type gallium nitride-based device which prevents a vacancy of a nitrogen inside a p-type gallium nitride layer to increase a hole concentration.

BACKGROUND ART

A gallium nitride (GaN) compound is a material that emits a light having a wavelength of various regions ranging from a visible light to an ultraviolet ray. The gallium nitride compound is widely used for an electrical device such as a large output/high temperature operation FET (Field Effect Transistor) and a HEMT (High Electron Mobility Transistor) as well as an optical device. Recently, the gallium nitride compound is used in manufacturing a blue LED (light emitting diode).

FIG. 1 is a perspective view illustrating a structure of a gallium nitride-based LED of a conventional art.

Referring to FIG. 1, the LED comprises a sapphire substrate 11, an n-type gallium nitride film 13, an active layer 15, a p-type gallium nitride film 17, a transparent electrode 19, an n-electrode 21 and a p-electrode 23.

A manufacturing process of the LED usually utilizes a MOCVD (Metal Organic Chemical Vapor Deposition) apparatus to grow the gallium nitride film on the sapphire substrate 11. Firstly, a buffer layer for aiding the growth of the gallium nitride film is formed on the sapphire substrate 11. Thereafter, the n-type gallium nitride film 13, the active layer 15 and the p-type gallium nitride film 17 are sequentially formed.

When an electric current flows through the n-electrode 21 and the p-electrode 23, a recombination of a hole and an electron occurs in the active layer 15 to emit a light. While an electrode is disposed on top of a p-layer and another electrode is disposed on a back of a substrate coupled to an n-layer in a conventional diode such that the electric current flows to a p-n junction, the electrode cannot be disposed on a back of the sapphire substrate 11 in the gallium nitride-based diode, which is an insulator. Therefore, the electrode has to be disposed directly on the n-type gallium nitride film 13.

Accordingly, the n-electrode 21 is disposed on the n-type gallium nitride film 13 which is exposed by etching a portion of the p-type gallium nitride film 17. Since the light is emitted from the p-n junction, the p-electrode 23 is disposed at an edge of the p-type gallium nitride film 17 such that the light is not blocked by the electrode.

While the gallium nitride film is disposed on the sapphire substrate 11, the film disposed on the sapphire substrate 11 is not restricted to the gallium nitride film. For instance, the gallium nitride film can be grown on a silicon carbide substrate.

A most important factor determining an electrical characteristic of a nitride light emitting diode is a characteristic of an ohmic contact between the p-type gallium nitride film and a metal layer. When a characteristic of the ohmic contact is poor, an operating voltage of the device is very high, thereby degrading a reliability of the device.

The ohmic contact refers to an area where two materials are in contact having a characteristic wherein the electric current flowing in a contacting portion is proportional to an electric potential difference of the contacting portion.

Methods for improving the characteristic of the ohmic contact of the GaN semiconductor device have been proposed. In accordance with one method, a Pt metal material having a high work function is used to lower a schottky barrier between a p-type gallium nitride interface. In accordance with another method, a compound reactive layer is formed by subjecting an interface between the p-type gallium nitride and a metal to a thermal process. For instance, a compound such as a NiO or a NiGax is formed at the interface using Ni/Au layer, or a PdGax compound is formed using a Pd electrode. A gallide compound such as the PdGax generates a vacancy of the gallium in the p-type gallium nitride, which serves as the hole.

Therefore, a tunnel junction effect wherein a height of a barrier is reduced by forming a high concentration of the hole at a surface of the p-type gallium nitride contacting the metal is obtained, thereby improving the characteristic of the ohmic contact. When a device is actually implemented, the two effects is obtained in a combined fashion.

However, the methods are limited in obtaining a sufficient characteristic of the ohmic contact because a vacancy of the nitrogen is also generated at the surface of the p-type gallium nitride during the heat treatment as well as the vacancy of the gallium. The vacancy of the nitrogen reduces a hole concentration contrary to that of the gallium.

Therefore, in order to obtain an optimum characteristic of ohmic contact, a method for increasing the hole concentration without generating the vacancy of the nitrogen in the p-type gallium nitride during the heat treatment is necessary.

DISCLOSURE

Technical Problem

It is an object of the present invention to provide a method for manufacturing a p-type gallium nitride-based (GaN) device that prevents a vacancy of a nitrogen in a p-type gallium nitride to increase a hole concentration.

Technical Solution

In order to achieve above-described object of the present invention, there is provided a method for manufacturing a p-type gallium nitride-based (GaN) device comprising steps of: (a) successively forming a n-type gallium nitride film, an active layer, a p-type gallium nitride film and a $MgN_x$ layer on a substrate; (b) diffusing an Mg source in the $MgN_x$ layer into the p-type gallium nitride film; and (c) removing the $MgN_x$ layer.

Preferably, the step (c) is carried out using a diluted nitric acid solution.

The $MgN_x$ layer may be formed at a temperature ranging from 600° C. to 700° C.

It is preferable that the step (c) is carried out by maintaining the $MgN_x$ layer at a temperature ranging from 650° C. to 750° C. for a time period ranging from 10 minutes to 1 hour in a MOCVD apparatus under an $N_2$ atmosphere.

Preferably, the step (b) is carried out via an RTA (Rapid Thermal Annealing) of the $MgN_x$ layer under an $N_2$ atmosphere at a temperature ranging from 650° C. to 1100° C. for a time period ranging from 10 to 60 seconds.

It is preferable that the $MgN_x$ layer is formed using a $Cp_2Mg$ gas and an $NH_3$ gas as a reaction gas, and a $N_2$ gas as a carrier gas.

Advantageous Effects

The method for manufacturing for the p-type gallium nitride-based (GaN) device in accordance with the present invention prevents the vacancy of the nitrogen in the p-type gallium nitride, thereby increasing the hole concentration.

BRIEF DESCRIPTION OF THE DRAWINGS

FIG. 1 is a perspective view illustrating a structure of a gallium nitride-based LED of a conventional art.

FIG. 2 is a flow diagram illustrating an embodiment of a manufacturing method of a p-type gallium nitride-based device in accordance with the present invention.

FIG. 3 is a graph illustrating a result of an AES depth-profiling of a specimen of an $MgN_x$ evaporation.

FIG. 4 is a graph illustrating a characteristic of an ohmic contact.

Hereinafter, a method for manufacturing a p-type gallium nitride-based device according to the present invention will be described in detail with reference to the attached drawings.

BEST MODE

FIG. 2 is a flow diagram illustrating an embodiment of a manufacturing method of a p-type gallium nitride-based device in accordance with the present invention.

Referring to FIG. 2, a buffer layer for aiding a growth of a gallium nitride film is formed on a substrate including a sapphire. An n-type gallium nitride film, an active layer and a p-type gallium nitride film are then sequentially formed thereon. Thereafter, an $MgN_x$ layer is formed on the p-type gallium nitride film (S101).

The $MgN_x$ layer serves as a source for a diffusion of Mg and a cappping layer during a heat-treatment as well. Preferably, the $MgN_x$ layer is formed using a $Cp_2Mg$ gas and an $NH_3$ gas as a reaction gas, and an $N_2$ gas as a carrier gas. Further, it is preferable that the $MgN_x$ layer is formed at a temperature ranging from 600° C. to 700° C. and a thickness thereof is 100 nm or less.

Thereafter, the $MgN_x$ layer is subjected to a heat treatment in a MOCVD apparatus under an $N_2$ atmosphere to diffuse the Mg in the $MgN_x$ layer into the p-type gallium nitride film (S103). Preferably, a the $MgN_x$ layer is maintained at a temperature ranging from 650° C. to 750° C. for a time period ranging from 10 minutes to 1 hour.

Alternately, the Mg in the $MgN_x$ layer may be diffused by subjecting the $MgN_x$ layer to an RTA (Rapid Thermal Annealing) or an heat-treatment in an electric furnace under the $N_2$ atmosphere at a temperature ranging from 650° C. to 1100° C. for a time period ranging from 10 to 60 seconds.

In accordance with the method for manufacturing the P-type gallium nitride-based device of the present invention, the Mg is diffused into the p-type gallium nitride film when subjected to the heat treatment such that a concentration of a dopant in the p-type gallium nitride film increases and the Mg doped in the p-type gallium nitride film is activated as well.

Generally, the p-type gallium nitride film includes a large amount of a hydrogen. The hydrogen is injected during the formation process using the MOCVD apparatus wherein the hydrogen exists in a form of an Mg—H. Therefore, the Mg is activated to serve as an accepter that generates a hole only when the hydrogen is removed.

In order to remove the hydrogen, an additional rapid thermal processing or a heat treatment in the electric furnace are required in the prior art. However, in accordance with the method for manufacturing the p-type gallium nitride-based device of the present invention, the additional heat treatment is not required since the Mg in the p-type gallium nitride film is activated simultaneously with the diffusion process of the Mg source in the $MgN_x$ layer into the p-type gallium nitride film.

Further, since the $MgN_x$ layer covers the p-type gallium nitride film, the nitrogen in the p-type gallium nitride film is effectively prevented from being separated therefrom. After the diffusion by the heat treatment is complete, the substrate is taken from the MOCVD apparatus. Thereafter, a remainder of the $MgN_x$ layer is removed with a diluted nitric acid solution. A surface of the p-type gallium nitride film is cleaned (S105).

Thereafter, a metal material for an n-electrode and a p-electrode is deposited thereon (S107), and the substrate is subjected to a heat treatment at a temperature ranging from 400° C. to 1000° C. (S109) to form the ohmic contact (S111) similar to a conventional method for manufacturing the nitride light emitting diode.

The ohmic contact for attaching the metal electrode on the n-type gallium nitride film and the p-type gallium nitride film can be understood from a movement mechanism of a carrier. Generally, a metal having high work function for tunneling a potential barrier is employed in order to form the ohmic contact having a low resistance at an interface of the semiconductor and the metal.

Particularly, a very high work function is required due to a wide band gap of about 3.4 eV of the gallium nitride film and an electron affinity. However, because the work function is limited, a width of a depletion layer at the interface of the semiconductor and the metal is reduced by increasing a concentration of the carrier at the interface of the semiconductor and the metal, thereby improving the tunneling of the carrier.

MODE FOR INVENTION

FIG. 3 is a graph illustrating a result of a depth-profiling of a specimen taken after carrying out the thermal diffusion process in the MOCVD apparatus using an AES (Auger Electron Spectroscopy).

As shown in FIG. 3, the $MgN_x$ layer exists on a surface of the specimen, while the Mg is diffused into the gallium nitride film under the $MgN_x$ layer.

In order to examine a Hall characteristic of the $MgN_x$ layer in accordance with the present invention, the Hall characteristic is compared by measuring the Hall characteristics of the p-type gallium nitride prepared in accordance with the conventional art and the p-type gallium nitride prepared in accordance with the present invention.

A thickness of each of the p-type gallium nitrides is set to be 1 μm, and the Hall characteristic is measured after preparing a Hall sample. A difference in the Hall characteristics of the p-type gallium nitrides in accordance with the conventional art and the present invention are not found according to the measurement. A Hall mobility and a Hall concentration are 2 cm²/Vs and $1\times10^{18}$ cm$^{-2}$, respectively.

In order to examine a change in a characteristic of the ohmic contact of the p-type gallium nitride layer having the Mg diffused therein in accordance with the present invention, electrical characteristics of the p-type gallium nitride layers in accordance with the conventional art and the present invention are compared.

The electrical characteristics are compared by measuring I-V characteristic after depositing a Pt electrode having a thickness of about 100 nm on each of the p-type gallium nitride layers. A distance between the electrodes is 5 μm. As shown in FIG. 4, the ohmic characteristic of the p-type gallium nitride and the metal manufactured according to the present invention is superior to that of the conventional art.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

INDUSTRIAL APPLICABILITY

In accordance with the method for manufacturing the p-type gallium nitride-based device of the present invention, the concentration of the hole of the p-type gallium nitride may be increased to provide the improved ohmic contact between the p-type gallium nitride and the p-electrode and the superior electrical characteristic for the nitride light emitting diode.

Furthermore, in accordance with the method for manufacturing the p-type gallium nitride-based device of the present invention, because the Mg doped in the p-type gallium nitride is simultaneously activated during the diffusion of the Mg source in the $MgN_x$ layer into the p-type gallium nitride, an additional heat treatment is not required for the activation of the Mg.

Moreover, in accordance with the method for manufacturing the p-type gallium nitride-based device of the present invention, because the $MgN_x$ layer covers p-type gallium nitride during the diffusion of the Mg in $MgN_x$ layer into the p-type gallium nitride, the nitrogen in the p-type gallium nitride film is effectively prevented from being separated therefrom.

The invention claimed is:

1. A method for manufacturing a p-type gallium nitride-based device, the method comprising steps of:
   (a) forming an n-type gallium nitride film on a substrate, an active layer on the n-type gallium nitride film, a p-type gallium nitride film on the active layer and a $MgN_x$ layer on the p-type gallium nitride film;
   (b) diffusing an Mg source in the $MgN_x$ layer into the p-type gallium nitride film; and
   (c) removing the $MgN_x$ layer.

2. The method in accordance with claim 1, wherein step (c) is carried out using a diluted nitric acid solution.

3. The method in accordance with claim 1, wherein the $MgN_x$ layer is formed at a temperature ranging from 600° C. to 700° C.

4. The method in accordance with claim 1, wherein step (b) is carried out by maintaining the $MgN_x$ layer at a temperature ranging from 650° C. to 750° C. for a time period ranging from 10 minutes to 1 hour in a MOCVD apparatus under an $N_2$ atmosphere.

5. The method in accordance with claim 1, wherein the $MgN_x$ layer is formed using a $Cp_2Mg$ gas and an $NH_3$ gas as a reaction gas, and an $N_2$ gas as a carrier gas.

6. The method in accordance with claim 1, wherein step (b) is carried out via an RTA of the $MgN_x$ layer under an $N_2$ atmosphere at a temperature ranging from 650° C. to 1100° C. for a time period ranging from 10 to 60 seconds.

* * * * *